United States Patent
Bernkopf

(10) Patent No.: US 6,844,673 B1
(45) Date of Patent: Jan. 18, 2005

(54) SPLIT-FABRICATION FOR LIGHT EMITTING DISPLAY STRUCTURES

(75) Inventor: Jan Bernkopf, San Jose, CA (US)

(73) Assignee: Alien Technology Corporation, Morgan Hill, CA (US)

( * ) Notice: Subject to any disclaimer, the term of this patent is extended or adjusted under 35 U.S.C. 154(b) by 176 days.

(21) Appl. No.: 10/020,385

(22) Filed: Dec. 6, 2001

(51) Int. Cl.[7] .......................... H01J 1/62; H01J 63/04
(52) U.S. Cl. .................... 313/506; 313/511; 313/512; 313/500; 313/505; 313/498; 445/24; 445/25
(58) Field of Search ................... 313/511, 512, 313/500, 505, 498, 506; 445/24–25

(56) References Cited

U.S. PATENT DOCUMENTS

| | | | | |
|---|---|---|---|---|
| 5,188,984 A | * | 2/1993 | Nishiguchi .................. 438/107 |
| 5,409,783 A | * | 4/1995 | Tang et al. .................. 428/690 |
| 5,670,251 A | * | 9/1997 | Difrancesco ................ 428/325 |
| 5,808,412 A | * | 9/1998 | Zovko et al. ................ 313/509 |
| 6,039,896 A | * | 3/2000 | Miyamoto et al. .......... 252/511 |
| 6,091,194 A | * | 7/2000 | Swirbel et al. .............. 313/498 |
| 6,246,179 B1 | * | 6/2001 | Yamada ..................... 315/169.3 |
| 6,291,896 B1 | | 9/2001 | Smith |
| 6,309,912 B1 | * | 10/2001 | Chiou et al. ................. 438/118 |
| 6,590,346 B1 | * | 7/2003 | Hadley et al. .......... 315/169.3 |
| 6,693,384 B1 | * | 2/2004 | Vicentini et al. ........ 315/169.1 |
| 2002/0158577 A1 | * | 10/2002 | Shimoda et al. ............. 313/506 |

* cited by examiner

*Primary Examiner*—Vip Patel
*Assistant Examiner*—Anthony T. Perry
(74) *Attorney, Agent, or Firm*—Blakely, Sokoloff, Taylor & Zafman LLP

(57) ABSTRACT

Methods and apparatuses for fabricating an electroluminescent display structure. A method including coupling a frontplane to a backplane wherein a frontplane top surface laminates to a backplane top surface. The frontplane and the backplane are fabricated separately. A first electrode layer which is transparent is disposed over the frontplane. A display medium which produces electro-optical effects upon a voltage application is disposed over the first electrode. A second electrode layer which is pattered is disposed over the display medium. The second electrode layer includes a plurality of connecting regions. The backplane is electrically active to provide driving signals for the display medium wherein the backplane includes a plurality of output pads to match the plurality of connecting regions.

40 Claims, 12 Drawing Sheets

SPLIT-FABRICATION FOR LIGHT EMITTING DISPLAY STRUCTURES

GOVERNMENT RIGHTS NOTICE

This invention was made with government support with at least one of these contracts: Grant (Contract) Nos. AFOSR 91-0327; F49620-92-J-059-1; F33615-96-C-5111 with USAF/AFMC/ASC; DAA016-00-C-9234 USAMCAC (US Army); Northrop Grumman PO #8200014995 (subcontract, N00014-99-C-0395 (prime)); North Dakota State University Subcontract #4080, DMEA 90-01-C-0009 (prime) and University of Alaska, Faibanks PO#FP201509 (subcontract), DMEA 90-01-C-0009 (prime). The Government has certain rights to this invention.

FIELD OF THE INVENTION

The present invention relates generally to the field of fabricating flat panel displays (FPD). Specifically, the present invention relates to methods and apparatuses for split-fabrication of light emitting or organic electroluminescent displays and display structures.

BACKGROUND OF THE INVENTION

Fabrication of flat panel displays is well known in the art. Flat panel displays may be comprised of active matrix or passive matrix panels. Active matrix panels and passive matrix panels may be configured as transmissive, reflective, transflective or emissive dislays. Liquid crystals, electroluminescent (EL) materials, organic light emitting diodes (OLEDs), or light emitting diodes (LEDs), to name a few, may be used in fabricating flat panel displays. Liquid crystal displays operate fairly reliably but their manufacturing process is complex and typically requires high power backlighting. OLED are among the currently favored display types due to their promise to deliver full color, flexible and inexpensive FPDs because of their simple manufacturing process.

OLEDs are electroluminescent (EL) devices that emit light generated by radiative recombination of injected electrons and holes within one or more organic EL layers of the OLEDs. OLEDs have electrical and optical characteristics which are attractive for operation within pixel-addressed displays. For example, OLEDs operate at low voltages and are relatively efficient in converting electrical current into light. In addition, OLEDs can be fabricated into thin, lightweight display devices. Furthermore, OLEDs can be designed to emit light of different colors to create color and multi-color display devices. Certain OLEDs have been shown to have sufficient brightness, range of color and operating lifetimes for use as a practical alternative technology to LCD-based full color flat-panel displays. Many of the thin organic films used in such devices are transparent in the visible spectral region.

Organic light emitting devices (OLEDs) comprise of several organic layers in which one of the layers comprises of an organic material that can be made to electroluminesce, by applying a voltage across the device. The organic material can be small molecule polymers or large molecule (conjugated) polymers that are electroluminescent. FIG. 1A illustrates a simple example of an OLEDs structure, an OLED display device 1 of a current state of the art. The OLED display device 1 includes a substrate 2, an anode layer 4, an organic electroluminescent (EL) region 6, and a cathode layer 8. It is also common that the EL region 6 comprises a hole transport layer (HTL) 6c, a light emitting polymer layer 6b, and an electron transport layer 6a. The substrate 2 may be transparent or opaque. Thus, the display device may be configured to emit light through the substrate, or through the cathode layer 8. When light is emitted from the organic molecules (e.g., EL region 6) through the substrate 2, the OLEDs are referred to as bottom emitting OLEDs. When light is emitted from the organic molecules (e.g., EL region 6) through the cathode layer 8, the OLEDs are referred to as top emitting OLEDs.

In the bottom emitting OLEDs, the substrate 2 is transparent and can be made of glass or plastic. In the top emitting OLEDs, the substrate can be opaque and be made of Si, plastic or a flexible metal foil; the anode layer 4 is typically made of a transparent conducting material, such as Indium Tin Oxide (ITO); and, the cathode layer 8 is typically made of a conducting metal with a low workfunction, such as Ca or Mg. The anode layer 4 and the cathode layer 8 are patterned, so that individual pixels of the display device can be addressed. The organic EL region 6 is composed of at least one organic or polymer layer.

Although the relative positions of the anode and cathode layers 4 and 8 may be inverted, such structures yield devices with very low efficiency. Thus, conventional OLED display devices have typically been configured with the anode layer 4 located between the cathode layer 8 and the substrate 2, as illustrated in FIG. 1A. The reason for this preference is that the cathode layer is a more efficient injector of electrons when deposited on organic layer, e.g., when it is the last deposited layer of the stack.

LEDs and OLEDs are similar in that both the LEDs and the OLEDs emit light when electrical current passes through the device (diode) except that OLEDs use organic material in the formation of the diode of the LEDs.

The current state of the art in fabricating organic light emitting diode structures is using one substrate on which all the layers (including addressing buses are deposited). The OLED structure is then encapsulated or capped with a lid having either a periphery seal or globally distributed adhesive.

Under the current art, depositing light emitting polymers onto the substrate on which all of the layers are to be deposited subjects the finished product to poor quality problem. FIG. 1C illustrates an exemplary active matrix 20 made with OLED using the current technology. The active matrix 20 includes a substrate 32, a plurality of thin film transistors 30 made from silicon materials formed on top of substrate 32. An ITO layer 34 (an anode) is deposited between each thin film transistors 30 and is electrically connected to the thin film transistors 30. An HTL layer 36 is deposited on top of the ITO layer 34. A thin layer of light emitting polymer 37 is deposited on top of an HTL layer 36. A cathode electrode layer 38 is then deposited on the light emitting polymer layer 37. Under the current art, only a limited number of transistors (e.g., 2–4 transistors) per pixel area can be formed in this region. This limitation limits the options for driving the display medium, which in turn contributes to brightness nonuniformity typically seen in these types of active matrix displays.

Another way of making an active matrix display is illustrated by way of an example in FIG. 1B. FIG. 1B illustrates a polymer dispersed liquid crystal display 10 (PDLC). The PDLC display 10 includes a substrate 12, integrated circuits 14, planarization layer 16, a metalization layer 18, a PDLC display medium 22, an ITO layer 24, and backing layer 26. The metalization layer 18 connects one integrated circuit 14 to another and also forms a patterned electrode to define an active pixel area. When applying this configuration to making an OLED display, one problem with this configuration is that more complex planarization is required since the OLED display medium is usually too thin resulting in defects if the topography of the surface is not perfectly planarized. In addition, the metalization layer 18 must be replaced by ITO for the most common configuration of a bottom emitting display.

SUMMARY OF THE INVENTION

The present invention relates to an electroluminescent display structure and methods of fabricating the same. One exemplary method includes coupling a frontplane to a backplane, a first top surface of the frontplane laminates to a second top surface of the backplane. The frontplane and the backplane are fabricated separately. A first electrode layer which is transparent is disposed over the frontplane. A display medium which produces electro-optical effects upon a voltage application is disposed over the first electrode. A second electrode layer which is patterned is disposed over the display medium. The second electrode layer includes a plurality of connecting regions. The backplane is electrically active to provide driving signals for the display medium wherein the backplane includes a plurality of output pads to match the plurality of connecting regions.

BRIEF DESCRIPTION OF THE DRAWINGS

The present invention is illustrated by way of example and not limitation in the figures of the accompanying drawings, in which like references indicate similar elements and in which:

FIG. 2 illustrates a frontplane having a display medium, FIG. 3 illustrates a backplane having functional blocks to drive the display medium, FIG. 4 illustrates an alignment of the frontplane over the backplane prior to the lamination of the frontplane to the backplane, and FIG. 5 illustrates the final assembly of a display structure that can be used for a flat panel display;

DETAILED DESCRIPTION OF THE INVENTION

In the following description, for purposes of explanation, numerous specific details are set forth in order to provide a thorough understanding of the present invention. It will also be appreciated that although the following examples relate to a making of a display, the present invention can be applied to a wide area of electronic devices without deviation from the merit of the invention. The following description and drawings are illustrative of the invention and are not to be construed as limiting the invention.

Figure 1A:
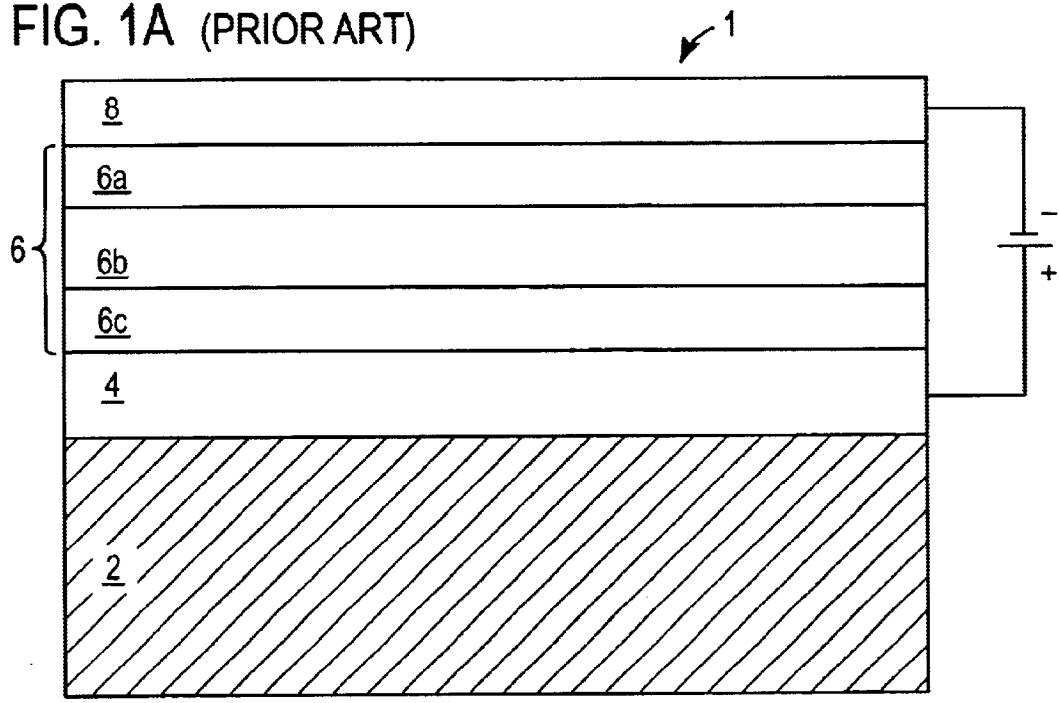
FIGS. 1A, 1B and 1C illustrate exemplary embodiments of display structures of the prior art.
Figure 1B:
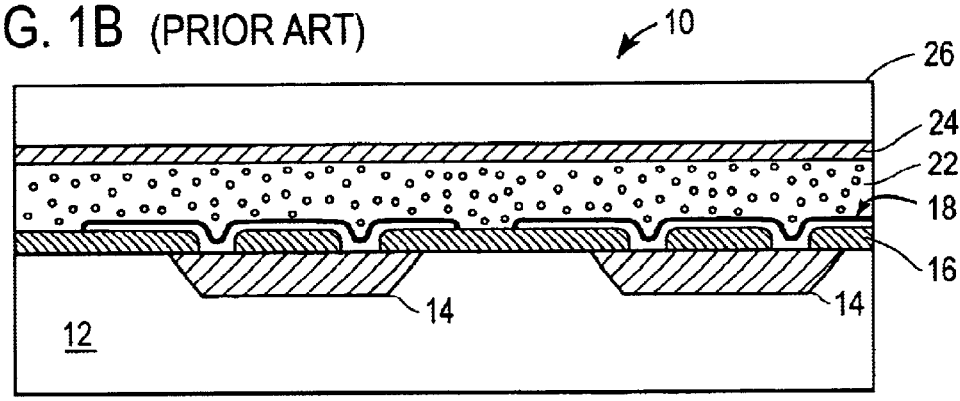
Figure 1C:
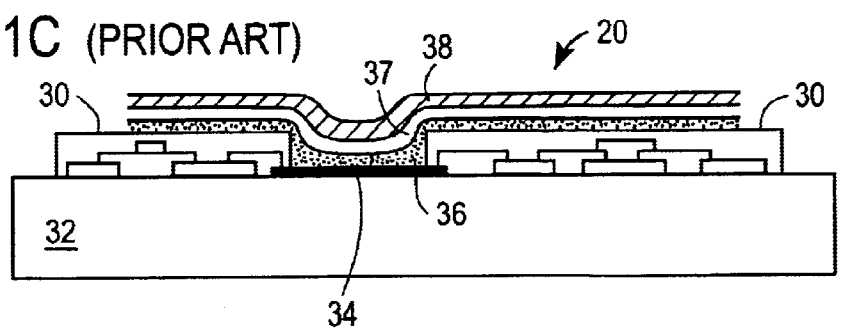
Figure 2:
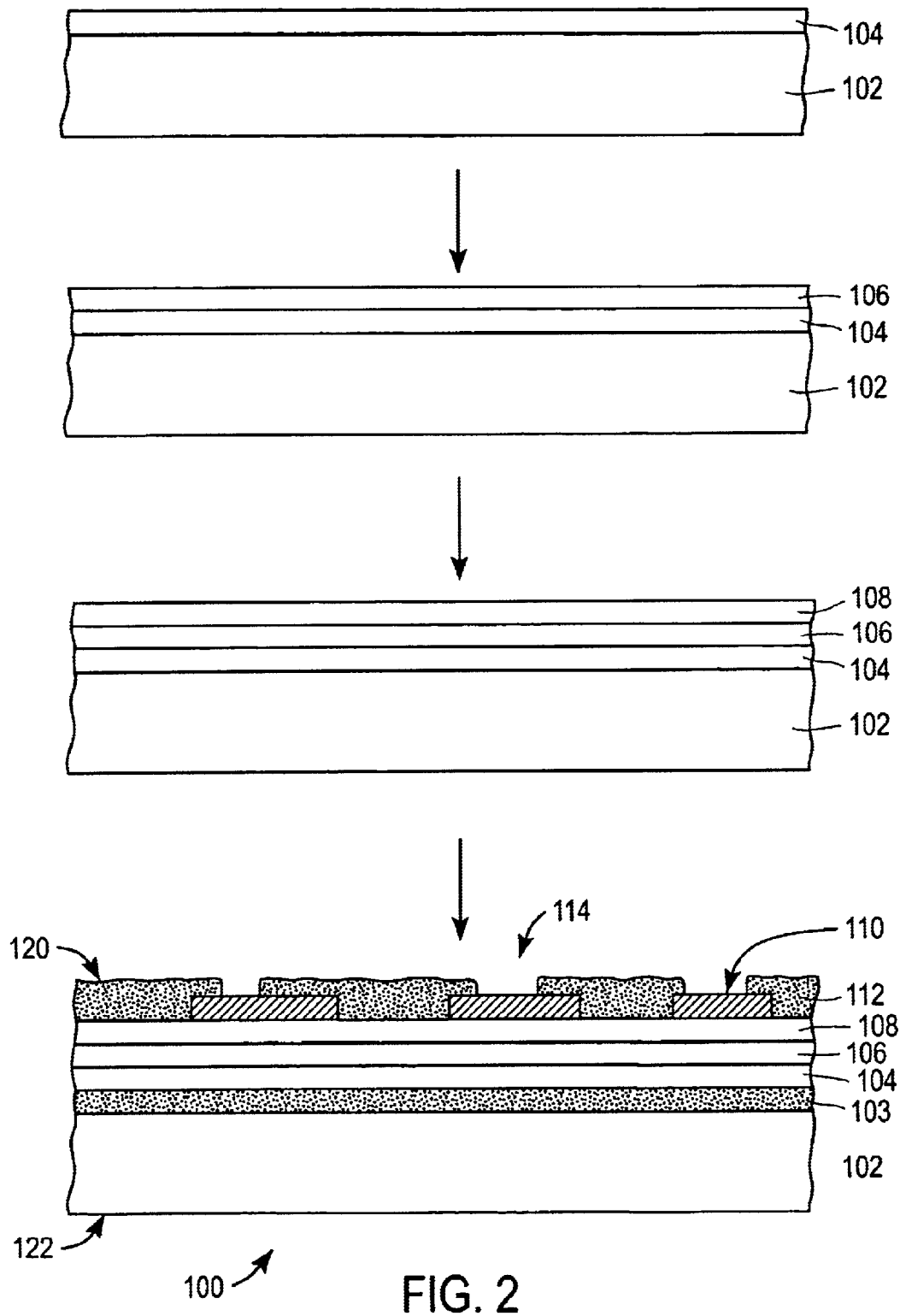
FIGS. 2 to 5 illustrate exemplary embodiments of the present invention; specifically.
Figure 3:
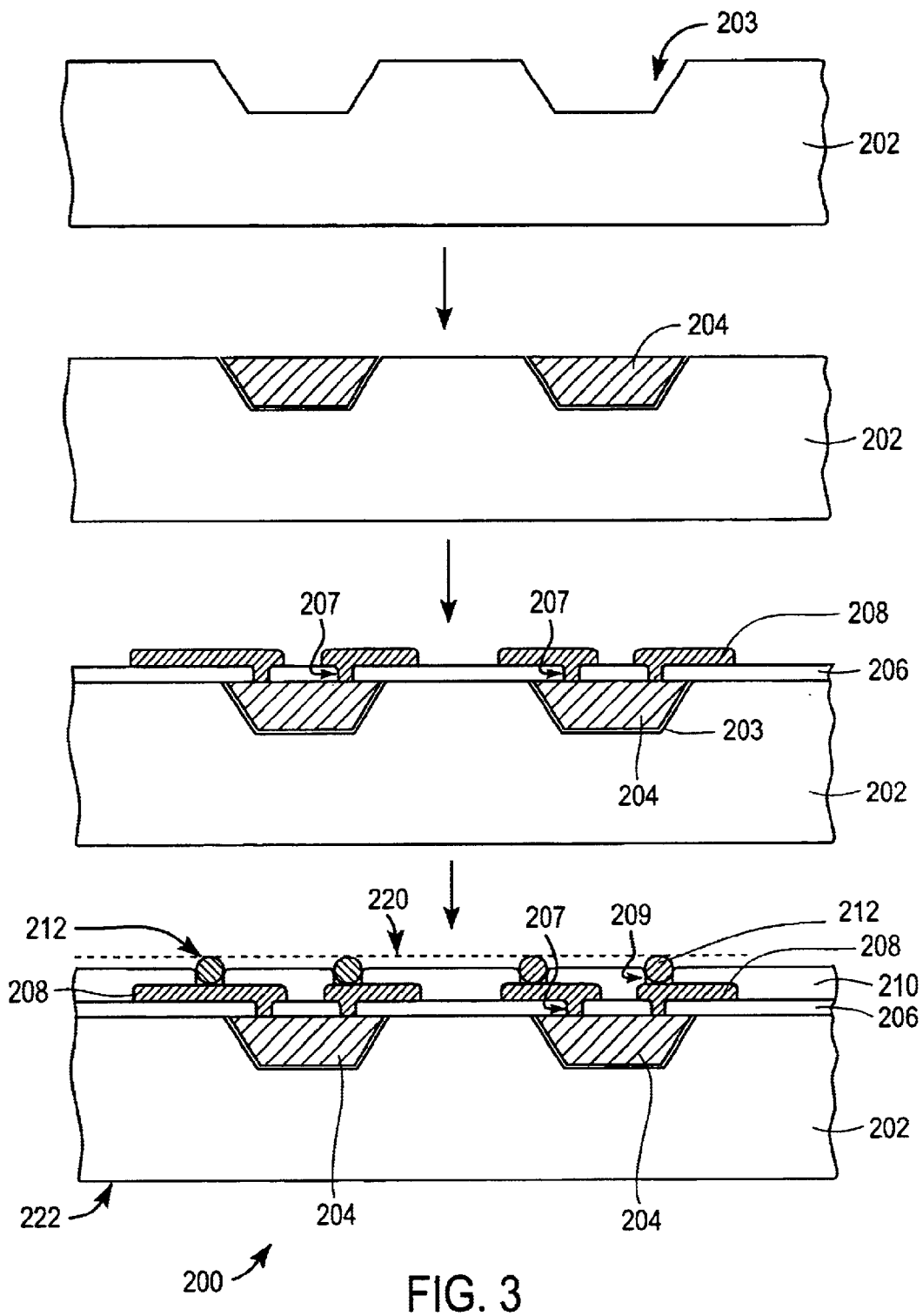
Figure 4:
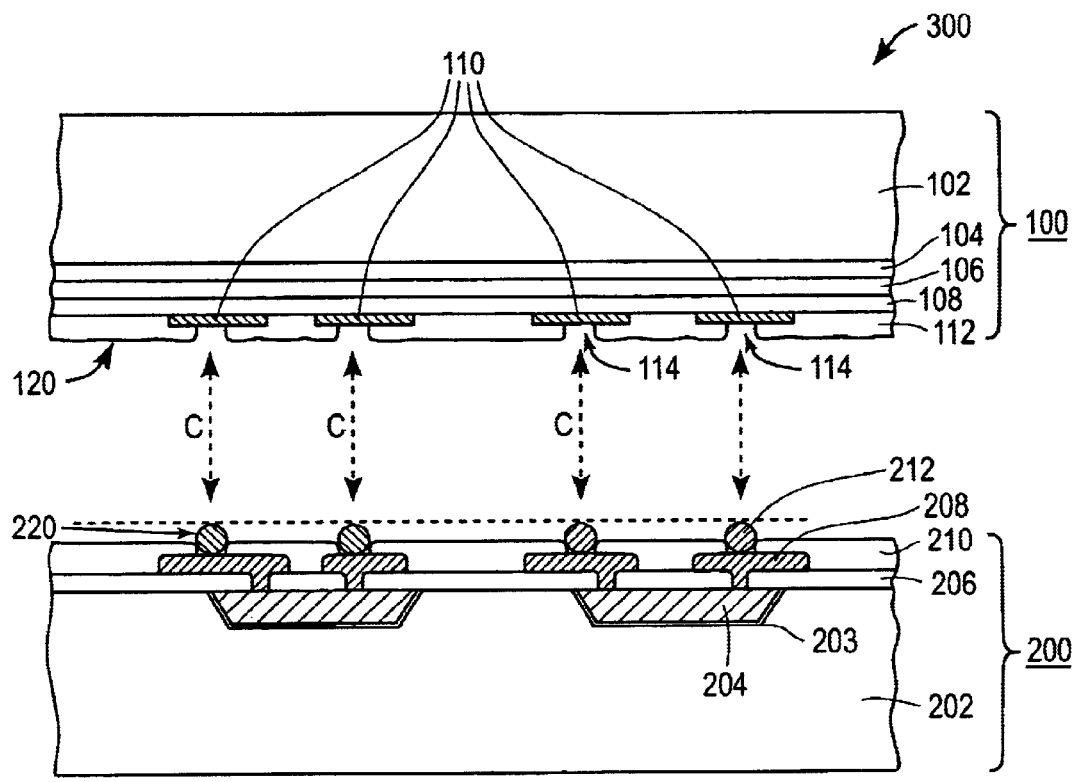

FIGS. 2 to 5 illustrate exemplary embodiments of the present invention with FIGS. 2 to 4 illustrate in details of how different layers of a display structure are laminated together. The display structure of the present invention includes an electroluminescent device that is a light emitting display structure. The electroluminescent device can be made out of an organic light emitting diode (OLED), or a polymer light emitting diode (PLED), also called a light emitting polymer (LEP) structure. One exemplary application of the electroluminescent device is fabrication of a flat panel display. Even though this disclosure discusses in length the application of the present invention into flat panel displays, it is contemplated that the present invention has a wider application than in the flat panel displays without deviating from the scope of the invention.

Figure 5:
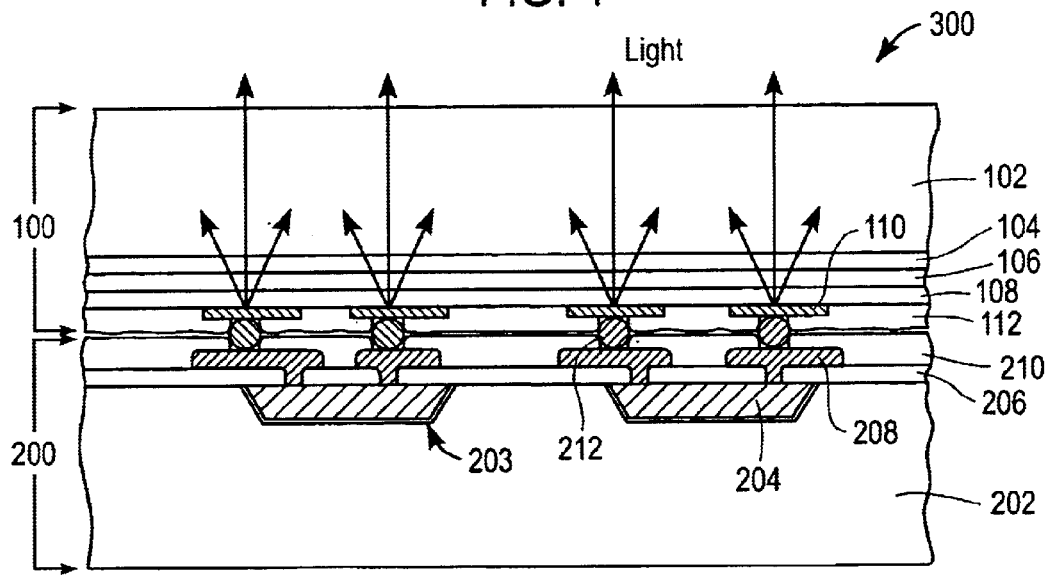

In a display, the electroluminescent device operates as a display device having one or multiple layers of organic materials that can emit light from various regions (pixels or segments) as current is passed through the display medium. The electroluminescent device here can be used for a monochrome display, a color display, or a multi-color display. FIG. 5 illustrates an electroluminescent display device as a final laminated device that can be used for a flat-panel display.

There are multiple layers of materials in a typical electroluminescent display device, for example, a substrate, a display medium, an insulation, and metalization, etc. In the current state of the art, all of the layers of a light emitting display structure, including addressing buses, are deposited on only one plane (e.g., the backplane of a display) in sequence of deposition and patterning of thin films. The electroluminescent display device is then encapsulated or capped with a lid having either a periphery seal or globally distributed adhesive. Exemplary disadvantages of the current art are cost and yield. In the current art, layers and components that can be fabricated at lower cost and under a less stringent condition are fabricated together with the fabrication of layers and components that require a stricter fabrication condition. This unnecessarily drives up the cost of fabricating the display. The loss in yield is magnified in that if one component or layer is defective, all of the good components and layers are discarded in the whole final fabricated device that has the defective component.

FIG. 5 illustrates an exemplary electroluminescent display of the present invention which includes a front plane 100 and a backplane 200 wherein each of the front plane 100 and the backplane 200 is fabricated separately according to FIG. 2 and FIG. 3. In one example, the front plane 100 includes an electroluminescent medium (e.g., OLED or PLED display media). The backplane 200 includes driving circuitry. The two substrates are then laminated or mated together using any suitable conductive adhesive (see FIG. 4). The front plane 100 and the backplane 200 are laminated together such that the top surface of the front plane 100 (e.g., first top surface 120) and the top surface of the backplane 200 (e.g., second top surface 220) are laminated to each other. FIG. 4 illustrates that the front plane 100 is "flipped over" onto the top of the backplane 200.

FIG. 2 illustrates an exemplary embodiment of the front plane 100. The front plane 100 includes a frontplane substrate 102, a first electrode layer 104, a hole transport layer (HTL) 106, an electroluminescent medium (small molecule or conjugated polymer) 108, a second electrode layer 110, and optionally, a nonconductive barrier layer 112.

The frontplane substrate 102 of FIG. 2 can be made out of a rigid or flexible material depending on applications. When bending in the display area is required, for example, the frontplane substrate 102 should be made out of a flexible material. When a large display is desired, the frontplane substrate 102 can be made out of a rigid material. In a preferred embodiment, the frontplane substrate 102 is flexible and transparent. The transparent frontplane substrate 102 can be made out of silica, glass, transparent polymer, sapphire, quartz, or other suitable plastic material.

The first electrode layer 104 of FIG. 2 is referred to as an anode layer for the front plane 100. The first electrode layer 104 is continuous in active area. The first electrode layer 104 can be made out of ITO, Au, $SnO_2$, or other suitable light transmissive electrically conductive materials. Preferably, the first electrode layer 104 is made out of a high work function material to efficiently inject holes into the HTL layer 106.

In one preferred embodiment, the first electrode layer 104 defines active area in the display. The first electrode layer 104 is formed on the frontplane substrate 102 by first being blanketly deposited over the frontplane substrate 102. Patterning of the first electrode layer 104 is typically done by removing (etching) the conductive material from the area where the periphery seal is formed.

The HTL layer 106 of FIG. 2 is vacuum deposited, grown on, spun on, or otherwise deposited onto the surface of the first electrode layer 104. The HTL layer 106 functions to carry holes (positive charge) from one side to another, for example, from the electrode 104 to the electroluminescent medium 108 (e.g., made of light emitting polymers). The HTL layer 106 can also be made of materials consisting of triaryl amines in various forms which show high hole (positive charge) mobilities. Common HTL materials include 4,4'-bis[N-(1-naphthyl)-N-Phenyl-amino]biphenyl (.alpha.-NPD), N,N'-diphenyl-N,N'-bis(3-methylphenyl)1-1'biphenyl-4,4'diamine (TPD), and 4,4'-bis[N-(2-napthyl)-N-phenyl-amino]biphenyl (.beta.-NPD). In a preferred embodiment, the HTL layer 106 is made out of PEDOT (3,4-polyethylenedioxythiopene-polystyrenesulfonate).

An electron transport layer (not shown) (e.g., oxidiazol, triazol, and triazine) is optionally included in the front plane 100. Typically, the electron transport layer (ETL) is needed between the cathode 112 and the light emitting layer 108. ETL is typically required when the OLED display is made out of small molecule polymer materials. In the preferred embodiment, the ETL is not necessary. In one example, when the second electrode layer 110 is made out of CaAl which matches the work function of the electroluminescent medium 108, efficiency of injecting electrons into the electroluminescent medium 108 can be achieved without the presence of the ETL.

The electroluminescent medium 108 of FIG. 2 can be made of one layer or multiple layers of organic or inorganic materials that have light emission capability (e.g., an organic or inorganic electroluminescent medium). In a preferred embodiment, the electroluminescent medium 108 is formed from an organic solvent solution, which can be deposited onto the HTL layer 106 via spinning and curing. In another example, the electroluminescent medium 108 is an inorganic electroluminescent material such as zinc sulfide doped with manganese typically used for thin film electroluminescent display. In the final assembly, the electroluminescent medium 108 can be made to electroluminesce by applying a voltage or by a passage of electrical current through the display structure. A color display can be made using patterned layers of the electroluminescent medium 108.

The second electrode layer 110 of FIG. 2 is typically referred to as a metallic cathode layer. The second electrode layer 110 is patterned to form a pixel array in a display. The second electrode layer 110 also defines the non-active and active regions on the electroluminescent medium 108. The second electrode layer 110 can be deposited onto the electroluminescent medium 108 using conventional deposition technique such as thermal evaporation through a shadow mask: In a preferred embodiment, the deposition of the second electrode layer 110 is done in a high vacuum environment to ensure that cathode regions are not oxidized or affected by water.

In a preferred embodiment, the second electrode layer 110 is made out of a low work function metals to efficiently inject electrons into the electroluminescent medium 108. The cathode layer can be made out of Calcium, Ytterbium (Yb), or Magnesium, MgAg, or LiAg materials, to name a few. Other suitable cathode materials can be used.

The barrier layer 112 of FIG. 2 is preferred in most embodiments of the present invention. This barrier layer is an inorganic layer, organic layer, or a combination of both, and can be made out of silicon nitride or other compatible material that can insulate and protect the electroluminescent medium 108. The barrier layer 112 protects the electroluminescent medium 108 from water, oxygen, other contaminants, or micro contaminants. The barrier layer 112 prevents degradation to the electroluminescent medium 108.

In one embodiment, the barrier layer 112 is deposited onto the second electrode layer 110. The barrier layer 112 constitutes a top surface 120 of the front plane 100. As will be seen, the top surface 120 and not a bottom surface 122 is the surface that is laminated against the second substrate.

The barrier layer 112 is only deposited over non-connecting regions of the patterned electrode layer 110. In a preferred embodiment, the barrier layer 112 covers most of the second electrode layer 110 except over a plurality of predetermined regions where electrical connections will be established. These regions are sometimes referred to as connecting regions. Connecting regions of the patterned electrode layer 110 are indicated by openings 114. The openings 114 can be created using conventional techniques such as photolithography, and etching commonly used to create vias in a layer of a semiconductor device. It is through these openings 114 that the electrical current passes through each pixel. Defining the openings 114 also helps in alignment of the laminating or the mating of the front plane 100 and the backplane 200 together. (See FIGS. 9A to 9D discussion below).

In a preferred embodiment, the front plane 100 of FIG. 2 also includes a barrier layer 103 much like that of barrier layer 112. The barrier layer 103 is located between the first electrode layer 104 and the frontplane substrate 102 to prevent contaminants from leaking through the frontplane substrate 102.

The front plane 100 discussed above can be made in a web line process and the resulting product can be rolled up and easily stored. In a preferred embodiment, the front plane 100 is made out of flexible materials which can be stored in rolls until assembly to the backplane 200 is desired.

FIG. 3 illustrates exemplary embodiments of a backplane 200. The backplane 200 includes a backplane substrate 202 having a plurality of receptor sites 203, a plurality of functional blocks 204, a first planarization layer 206, a plurality of output pixel pads 208, a second planarization layer 210, and a plurality of conductive adhesive deposits 212.

The backplane substrate 202 can be made out of a flexible or rigid material which can be opaque or transparent. In a preferred embodiment, the backplane substrate 202 is opaque and is flexible. The backplane substrate 200 can be made in a web line process and the resulting product can be rolled up and easily stored. Besides producing a flexible display, a flexible backplane substrate 202 allows for easier storage after fabrication process. The backplane substrate 202 can be made out of a silicon wafer, a gallium arsenide wafer, a ceramic material, plastic, glass, silica, or any suitable substrate used in semiconductor or flat panel display field.

As indicated in FIG. 3, the backplane substrate 202 is shown to include a plurality of receptor sites 203 each of which is designed to couple to a functional block 204. There may be one functional block 204 in the backplane 200 or there may be a plurality of functional blocks 204 depending on application. The receptor sites 203 can be produced by using techniques such as casting, stamping, embossing, and injection molding, among others. The exemplary embodiment illustrated in this figure depicts that the receptor sites are recessed regions created into the surface of the backplane substrate 202. However, having receptor sites being recessed is not a limitation of the present invention. If the backplane substrate is an organic material and is an amorphous or semicrystalline polymer, the receptor sites may be embossed into the polymer material with a mold that matches the block size and pitch for the device being produced. The receptor sites can be molded or carved into a surface, or, be designed as a raise area of a backplane substrate. The receptor sites can be recesses, protrusions, bulges, or protuberances.

It will be appreciated that embossing is just one method of forming the receptor sites in a polymeric coating on the glass. The coating may alternatively be injection molded onto the glass substrate during the coating process. Alternatively, the receptor sites could be formed in the polymer by solvent casting a polymer solution onto a receptor site mold. The solvent cast sheet could then be laminated or transferred to the glass substrate. Thus, the receptor sites 203 can be a mold formed on top of the substrate, and as such, need not be a recessed region in the backplane substrate 202.

Also shown in FIG. 3, the functional blocks 204 have a trapezoidal profile. The trapezoidal profile functional blocks 204 can be created using conventional methods. The receptor sites 203 in this example are designed to couple or mate with these blocks and thus, also have the trapezoidal profile. The receptor sites 203 may also have similar dimensions to these blocks 204. These similarities in shape and size help the receptor sites to easily accept the functional blocks 204 thereby facilitating perfect mating of these blocks 204 to these receptor sites 203.

It will be appreciated that the functional blocks 204 and the receptor sites 203 may have other shapes, for instance, a cylindrical shape, pyramid shape, rectangular shape, square shape, T-shape, kidney shape, or the like. Even with other shapes, the functional blocks 204 and the receptor sites 203 have similar shapes and dimensions for good mating.

The functional blocks 204 can be coupled to the receptor sites 203 by being flown over the backplane substrate 202 in a slurry solution (not shown). In general, these functional blocks 204 include semiconductors that are manufactured from silicon wafers (or other semiconducting materials). Alternatively, the functional blocks 204 can be a functional microstructure or a micro-scale electronic devices such as integrated circuit (not shown). These functional blocks 204 can also be the micro structure that have been invented and disclosed in a U.S. Pat. No. 6,291,896, and which is entitled "Functionally Symmetric Integrated Circuit Die." This patent is hereby incorporated herein by reference.

In one example, the functional blocks 204 can be deposited in the receptor sites 203 of the backplane substrate 202 such that they are recessed below a surface of the substrate 202. This surface of the backplane substrate 202 is the native surface of the backplane substrate 202 before any deposition of any other materials on top of this surface.

In another embodiment, the functional blocks 204 are NanoBlocks™ IC which are coupled to the receptor sites 203. (NanoBlock is a Trademark of Alien Technology Corporation, California).

The functional blocks 204 must also be formed prior to their mounting. The functional blocks 204 are designed and constructed to perform several functions. In one example, the electrical devices within the blocks 204 may be designed to drive one or a plurality of pixels in a display. They must gainfully perform some function for a completed assembly such as a circuit element (e.g., IC chip or discrete transistor).

The first planarization layer 206 of FIG. 3 is an insulation layer. The first planarization layer 206 comprises a plurality of openings, see vias 207 in FIG. 3. The first planarization layer 206 is a dielectric material, which can comprise of a material selected from a group of materials such as polyimide, epoxy, photo imageable polymer or permanent photoresists. The vias 207 can be created using techniques such as photolithography (photoresist masking) and etching.

The vias 207 allow access to the functional blocks 204 for necessary electrical connections. Each of the functional blocks 204 may comprise electrical conducting pads (not shown) on its surface. These conducting pads establish the electrical interconnections between the functional blocks 204 to each other (not shown) and to other necessary driving circuitry through the use of metal conductors.

Bus lines and electrical interconnections among the functional blocks 204 are depicted in these figures as the output pixel pads 208. The output pixel pads are generally output pads that are conductive. In one example, the output pixel pads 208 are made of a conducting material that is deposited over the first planarization layer 206. This conducting material can be patterned to create the output pixel pads 208. The pattern associates with the locations of the vias 207 on the first planarization layer 206 in that the vias 207 give access paths for electrical connections between the output pixel pads 208 and the function blocks 204. The conducting materials that can be used to create the output pixels pads 208 include metal and metal nitrides such as aluminum, molybdenum, ITO, or other suitable conductive material.

In one embodiment, the backplane substrate 200 includes the second planarization layer 210, as shown in FIG. 3. The second planarization layer 210 is also an insulation layer. Similar to the first planarization layer 206, the second planarization layer 210 may comprise a plurality of openings, see vias 209 in FIG. 3. The second planarization layer 210 is a dielectric material which could comprise a material selected from a group of inorganic or organic materials such as polyimide, epoxy, photo imageable polymer, or permanent photoresists. In one example, the second planarization layer is made out of $SiO_2$.

The vias 209 allow access to the output pixel pads 208 and ultimately, establish necessary electrical connections from the functional blocks 204 to other active components of the final product, e.g., OLED display structure. As will be apparent, the accesses through the vias 209 in the second planarization layer 210 increases probability for functional aligning by enabling greater assembly tolerance when the first substrate 100 mates with the backplane substrate 200.

FIG. 3 illustrates that in one embodiment, the conductive adhesive deposits 212 constitute a top surface 220 of the backplane 200. When the front plane 100 is laminated to the backplane 200, the top surface 120 of the front plane 100 mates against the top surface 220 and a bottom surface 222 of the backplane 200.

The conductive adhesive deposits 212 in FIG. 3 are selected from adhesive materials that can provide conductivity between the output pixel pads 208 and the electrodes in the front plane 100 (e.g., silver epoxy). The conductive adhesive deposits 212 can be metered into the vias 209. In one example, the conductive adhesive deposits 212 are made out of film of a conductive adhesive material that only conduct in the Z-axis and as such, they only conduct in direction perpendicular to the surfaces. In this example, the conductive adhesive deposits can be laminated on the vias 209.

The conductive adhesive deposits 212 adhere the front plane 100 to the backplane 200 for the final structure. The electrical connections are also confined to the areas where the conductive adhesive deposits 212 are located. Having the electrical connections so confined gives bigger tolerance for the fabrication of the displays made according to the present invention.

FIG. 4 illustrates a schematic cross-section of an electroluminescent display structure 300 with the front plane 100 and the backplane 200 being aligned for lamination and/or mating. As indicated by the arrow lines C, the conductive adhesive deposits 212 will contact and adhere to the second electrode 110 through the openings 114 as the first substrate 100 and the second substrate 200 are being laminated (pressed) together.

During lamination, the front plane 100 and the backplane 200 may be aligned using conventional web registration such that the conductive adhesive pads 112 are aligned over the openings 114 for final lamination. FIG. 5 illustrates the laminated electroluminescent display structure 300 in which the front plane 100 and the backplane 200 have been mated together.

FIGS. 4 and 5 illustrate how the front plane 100 is coupled to the backplane 200. The front plane 100 was "flipped over" on top of the backplane 200 for lamination. In one preferred embodiment, the conductive adhesive deposits 212 on the backplane 200 constitute the top surface 220 of the backplane 200. The barrier 112 of the front plane 100 constitutes the top surface 120 of the front plane 100. When the front plane 100 is flipped over, the top surface 120 laminates to the top surface 220.

The electroluminescent display structure 300 is a virtual top emitting structure even though the front plane 100 was originally made like a bottom emitting structure. The virtual top emitting structure maximizes the advantages of a bottom emitting electroluminescent (e.g., OLED/PLED) display structure. Furthermore, the virtual top emitting structure also behaves like a top emitting display structure in that the light emission needs not to pass by any opaque electronic devices. The fill factor ratio is thus maximized. (See detailed explanation below).

Figure 6:
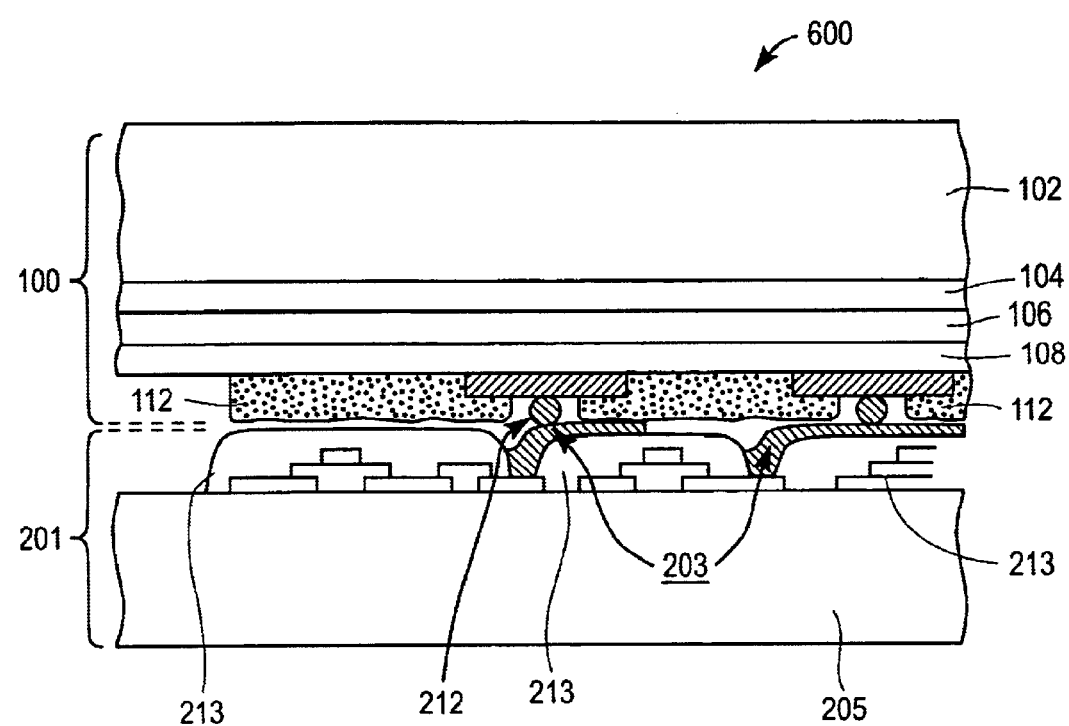
FIG. 6 illustrates another exemplary embodiment of a light emitting display structure of the present invention using thin film transistors to drive the display media.

In an alternative embodiment to the electro luminescent display structure 300 which comprises of the backplane 200 as illustrated in FIG. 3, FIG. 6 illustrates an exemplary embodiment of an electro luminescent display structure 600. In the embodiment display structure 600, a backplane 201 is laminated to the front plane 100 discussed above. The backplane 201 can be made using conventional method of making an electrically active substrate for an active matrix display except without forming the display medium directly on the backplane 201. The backplane 201 includes a backplane substrate 205 which is further coupled to a plurality of thin film transistors 213. The backplane substrate 205 can be made out of material similar to the backplane substrate 202 described above. The thin film transistor 213 can be made using well established in methods in semiconductor technology. The thin film transistors 213 are designed to drive electrical signals for the display medium 108 of the front plane 100 when the front plane 100 and the backplane 201 are laminated together. The backplane 201 further includes a plurality of output pads 203 (e.g., a cathode) which can be made out of aluminum, molybdenum, ITO, or other suitable conductive material. The output pads 203 is similar to the output pads 208 described above. In this embodiment, the output pads 203 match the connecting regions included in the second electrode layer 110 of the front plane 100. The electrical signals are established when the output pads 203 contact the second electrode layer 110. In one example, conductive adhesive deposits 212 are also used to create this contact as discussed above.

As mentioned above, the backplane substrate 102 (of FIG. 2) or the backplane substrate 205 (of FIG. 6) of the present invention need not be transparent to take advantage of the efficiency observed in a bottom emitting display structure. There is thus more flexibility in choosing the material for these backplane substrates 200 and more saving on material costs. The OLED or PLED display structure of the present invention thus maximizes advantages of a top emitting as well as a bottom emitting display structure. It is well established that a bottom emitting display structure has better light extraction efficiency, however, at the expense of lower fill factor, which requires the media to be driven harder. And, a top emitting display structure has a about fifty percent (50%) loss in light extraction due to poor transparency of the metal electrode (cathode). The top emitting display structures, however, allows for more flexibility in material choice for the substrates. This is further explained below in FIGS. 7A and 7B.

Figure 7A:
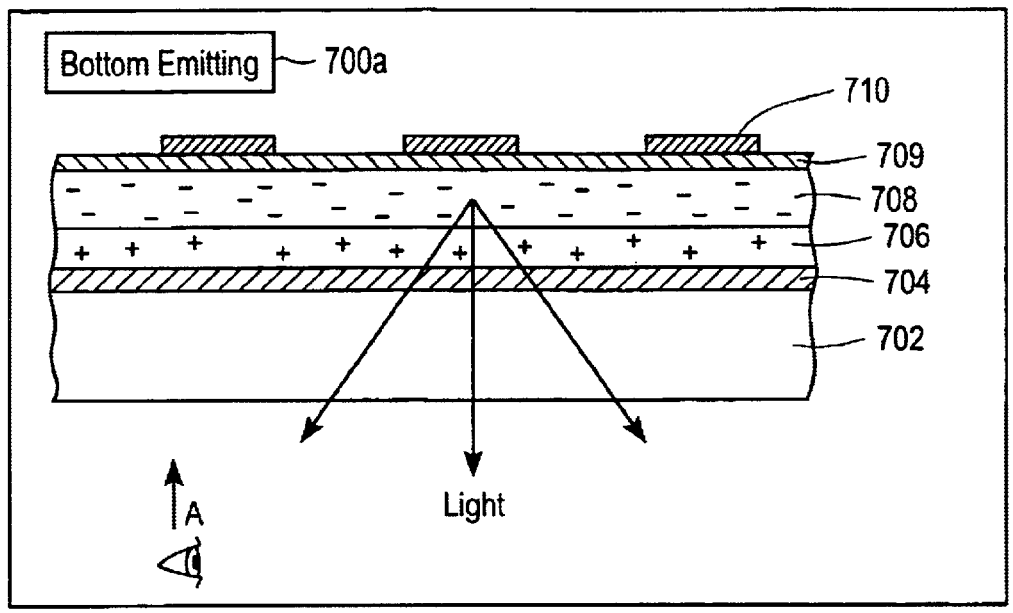
FIGS. 7A to 7F illustrate an exemplary bottom emitting structure with the low fill factor ratio problems of the current state of the art, an exemplary top emitting structure with the loss in light output problem of the current state of the art and illustrations of these problems.
Figure 7B:
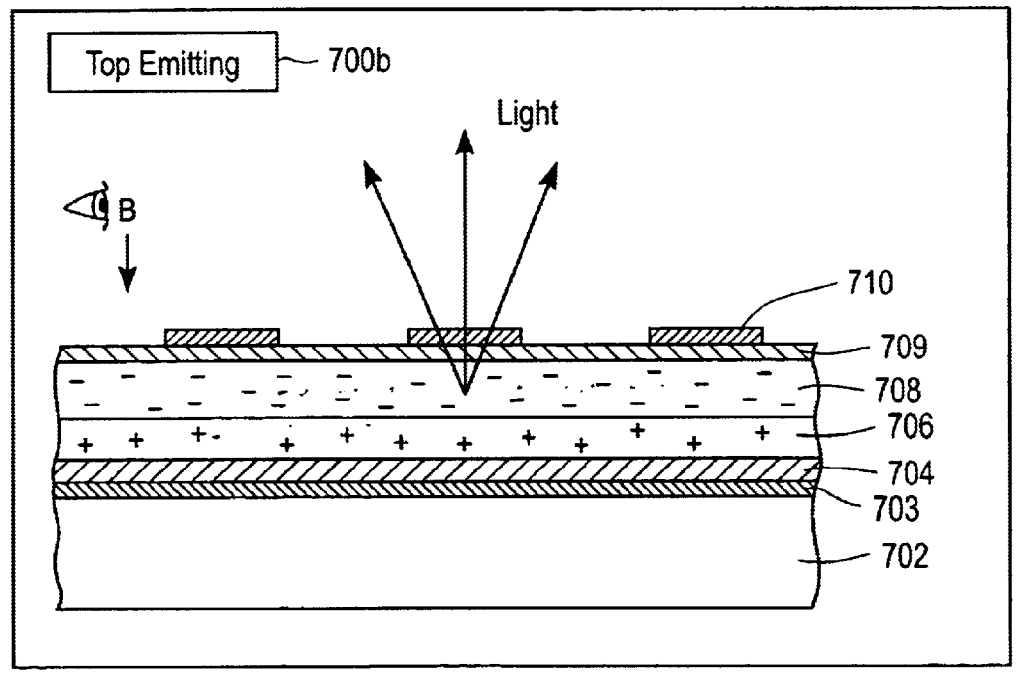

FIGS. 7A and 7B illustrate exemplary conventional embodiments of a bottom emitting display structure 700a and a top emitting display structure 700b. The bottom emitting display structure 700a includes a transparent substrate 702, which is coated by an (patterned) ITO layer 704 (an anode transparent electrode), which is further coated with an HTL layer 706, and which is then coated with a light emitting polymer layer 708 and in some cases, an electron transport layer 709. A patterned cathode electrode layer is deposited on top of all those layers and is depicted by an electrode layer 710. When a current is passed through the bottom emitting display structure 700a, the light exits through the substrate 702. The viewer observes from direction A as shown in FIG. 7A. When assembled into a final display apparatus, there may be necessary electronic devices (not shown) within the structure to drive the display. The substrate layer 702 may have the electronic devices included therein. These electronic devices need to be connected to each other via metallization lines, for example. The metallization layers may be complex and optically dense. This will decrease the light output for the bottom emitting display structure 700a. Light cannot be emitted sufficiently through the area with dense metallization.

The top emitting display structure 700b illustrated in FIG. 7B may include an opaque substrate 702, which is coated by a (patterned) ITO layer 704 (or any metal or conductive organic material having appropriate work function). The ITO layer 704 is further coated with an HTL layer 706, which is then coated with a light emitting polymer layer 708 and in most cases, an electron transport layer 710. A patterned cathode electrode layer is deposited on top of all those layers and is depicted by an electrode layer 710. However, the difference is that the cathode electrode layer 709 needs to be made out of a transmitting cathode material. The transmitting cathode material will typically decrease the light output by as much as fifty-percent (50%). When a current is passed through the top emitting display structure 700a, the light produced in the light emitting polymer layer 708 will exit through the transparent cathode 710. The viewer observes from direction B as shown. The top-emitting structure gives the advantage of wider material choices for the substrate 702, but causes the loss in light output.

In the present invention, by fabricating the substrate for the electroluminescent medium (e.g., the front plane 100) and the substrate for the electrical devices (the backplane 200) separately, the resulting product optimizes the advantages of both, the bottom emitting structure and the top emitting structure. Furthermore, this virtual top emitting display allows the backplane to be an opaque backplane (e.g., an opaque backplane) giving flexibility to material choice. Thus, more suitable materials for construction of display can be used.

The aperture ratio is no longer affected by opaque structures such as buses, NanoBlock™ IC, functional blocks, or metallization. This can allow for larger pixels (at the same pitch), resulting in lower current density and thus more efficient, display. This is further explained below.

Figure 7C:
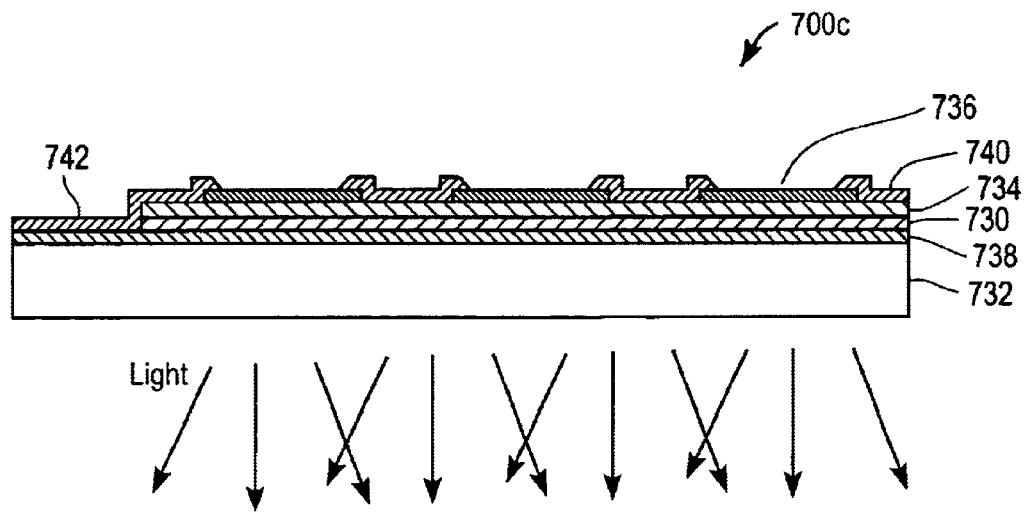

FIG. 7C illustrates another standard bottom emissive structure 700c that is one of the most common structures for OLED/PLED display devices. An ITO layer 730 (a transparent bottom electrode) is first coated on a transparent substrate 732 considering the technological compatibilities or incompatibilities of all of the layers involved. OLED or PLED layers 734 are then deposited. A metallic cathode layer 736 (an opaque top electrode) is deposited on top of the OLED or PLED layers 734. A transparent barrier layer 738 between the ITO layer 730 and the substrate 732 in order to provide hermetic seal in case of a plastic substrate. Another barrier 740 can also be coated over the metallic cathode layer 736. The structure 700c is sealed at the edges by an integrated periphery seal 742, where the two barrier layers meet.

Figure 7D:
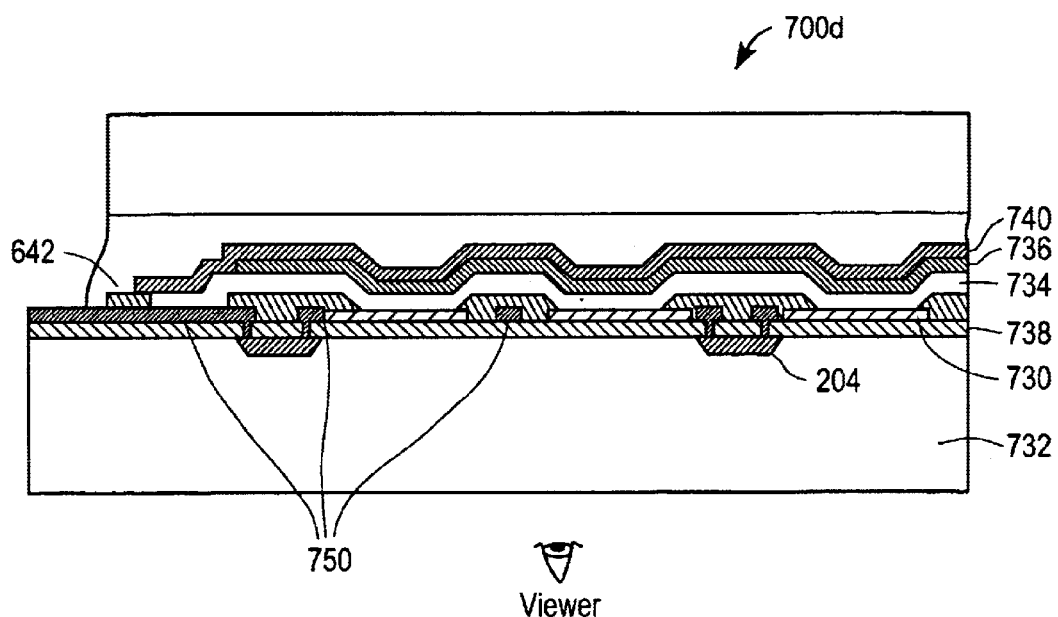

So because of ease of manufacture, the transparent electrode ITO layer 730 is at the bottom of the stack and light can only escape through the substrate 762 as the top electrode (cathode) 736 is made of opaque metallic layers. While this is fine for simple device it is more complicated for devices such as active matrix displays. FIG. 7D illustrates an exemplary active matrix display structure 700d which is a bottom emitting display structure. Display structure 700d comprises of opaque components such as p-Si thin film transistors (not shown) or functional blocks 204 in addition to opaque metalization 750 (wires) distributing the current and data to the active elements. Thus some of the generated light never reaches the viewer as the light is being blocked by those opaque structures or in another words, it has poor aperture ratio (fill factor).

To achieve a top emitting display structure (such as a top emitting structure 700e of FIG. 7E) it is desirable to reverse the sequence of the layers, starting with the opaque cathode on the glass structure and completing the PLED structure in reverse order. As mentioned above, the incompatibility of certain layers with such processing sequence typically do not allow such approach.

Figure 7E:
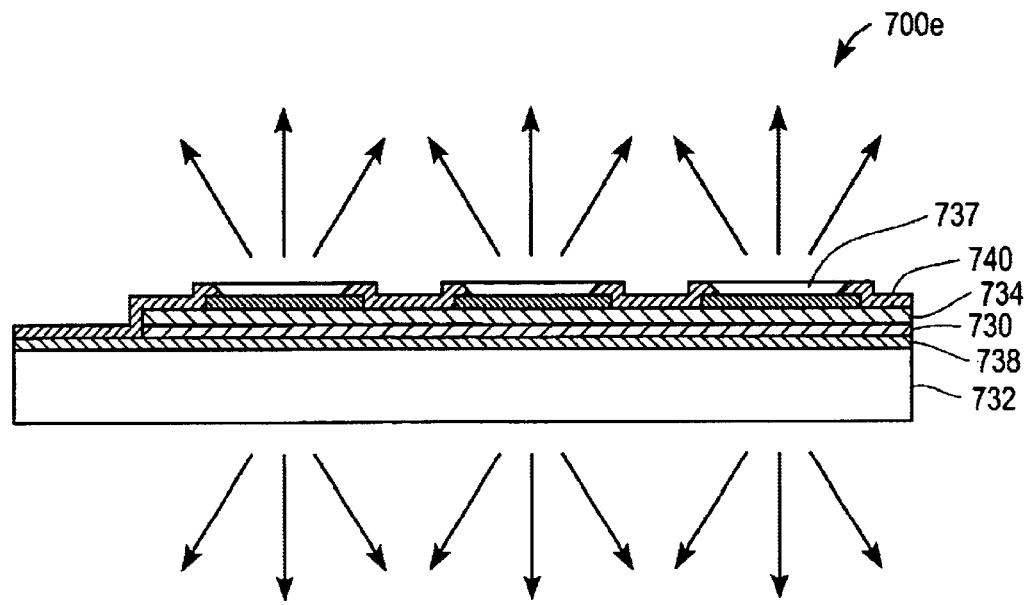

So the technologists came with the idea of a transparent cathode 737 on the top of the structure shown in FIG. 7E. It is (at least at the current state of affairs) very difficult to satisfy all the requirements on cathode material and have it transparent at the same time. One cannot simply use ITO because of work function mismatch. So people put down very thin layer of metal first to achieve the work function match and then overcoat it with the ITO. The layer 737 indicates a semitransparent cathode made out of a combination of a thin metal layer and the ITO. Such combination is transparent, but much less than the ITO itself. (In general, ITO has transparency slightly below 90%, while the combination of thin metal and ITO has combined transparency in the range of 30% to 50%.). Thus, there is an additional loss in extraction efficiency.

Up emitting structure with semi-transparent cathode. Fill factor is 100%, but some light is lost in the cathode. Typically one would like to have a reflecting substrate or the barrier layer; otherwise such structure emits light in both hemispheres as shown. So while in the up emitting structure the outgoing light is not screened by opaque elements of the active matrix circuitry (and thus fill factor can be theoretically 100%), more than 50% of the generated light is lost due to poor transparency of the cathode.

Figure 7F:
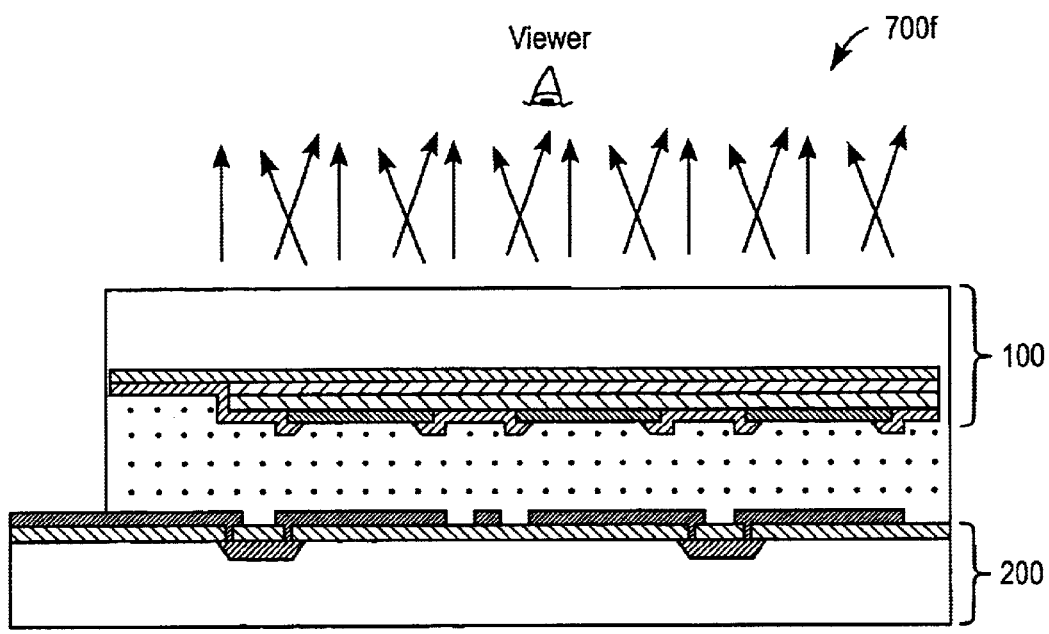

FIG. 7F illustrates an exemplary display structure 700f fabricated according to the present invention. The display structure 700f is similar to the display structure 300 shown in FIG. 5 where the front plane 100 and the backplane 200 are made according to the methods discussed above. In this illustration, the front plane 100 is a bottom emitting substructure. By flipping the bottom emitting structure 100 one may achieve 100% fill factor, yet the light is exiting towards a viewer through the highly transparent ITO anode. In the present invention, all of the opaque elements are not in the path of light exiting towards the viewer. Fill factor of 100% is achievable and the optical loss is minimal as the light exits through highly transparent ITO anode.

Furthermore, the separation of the substrate having the electroluminescent medium (e.g., the frontplane 100) and the substrate with the electrical devices (e.g., the backplane 200), the fabrication process is optimized. For example, the more expensive process requirement for fabricating the frontplane 100 containing the electroluminescent medium need not be imposed into the cheaper process requirement to fabricate the backplane 200 containing NanoBlock™ ICs. Moreover, the same process line can be used for other products. Ready made components (e.g., NanoBlock™ IC incorporated into a substrate) can be used for a variety of products (e.g., other displays, radio frequency identification tags, etc).

Figure 8A:
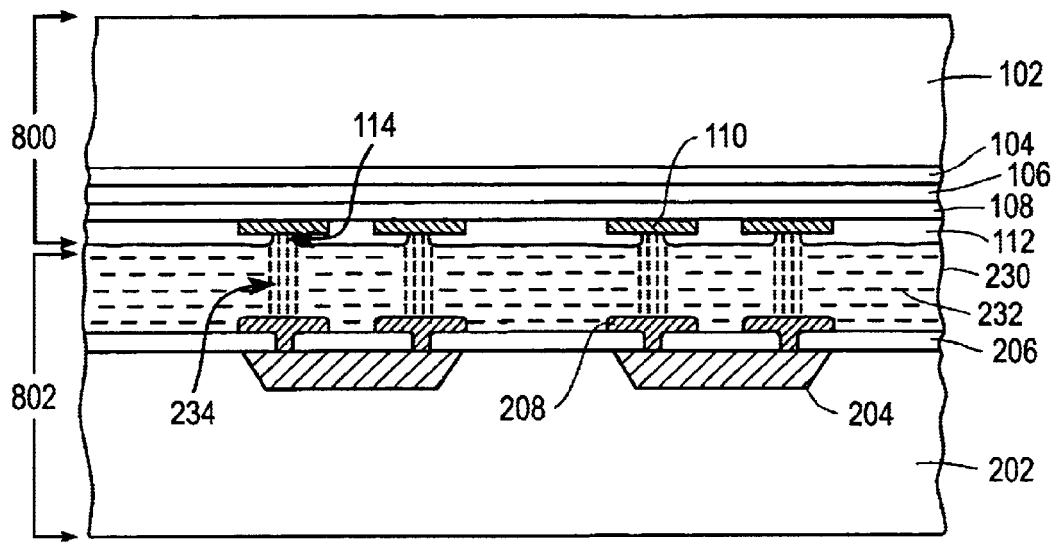
FIG. 8A illustrates an exemplary embodiment of a light emitting display structure using a patternable pressure sensitive adhesive (PSA) to laminate the structure's frontplane to the structure's backplane.

FIG. 8A illustrates yet another embodiment of the present invention. This figure illustrates a schematic cross-section of an electroluminescent display (e.g., OLED or PLED) structure utilizing patternable pressure sensitive adhesive for mating a front plane 800 and a backplane 802. The front plane 800 is fabricated similarly to the front plane 100 discussed above and the backplane 802 is fabricated similarly to the backplane 200 discussed above.

One difference is that there is no need for the conductive adhesive deposits 212 and the second planarization layer 210 as shown in FIG. 4. To laminate the front plane 800 and the backplane 802 together, a patternable pressure sensitive adhesive (PAS) that is conductive is used as a layer 230 between the frontplanes and the backplanes. A conductive polymer can also be used for this purpose. The layer 230 can be deposited (e.g., by being spun on) either on the first substrate 800 or on the second substrate 802 or both. The layer 230 can be patterned so there are two distinct regions, non-conducting regions 232 and conducting regions 234. Patterning of the patternable PSA can be done by etching, bleaching, or irradiating areas to be rendered nonconductive.

Under bleaching, a chlorine solution of suitable concentration is used to treat specific areas of the layer 230 making these areas non-conductive. In one specific example, the layer 230 is coated on the backplane 802 with a conductive polymer layer 230. A photoresist process can be used to mask the conducting regions 234. Chlorine solution can then be used to treat the layer 230 making the non-masked area non-conductive. The photoresist is then removed using any conventional method.

Figure 8B:
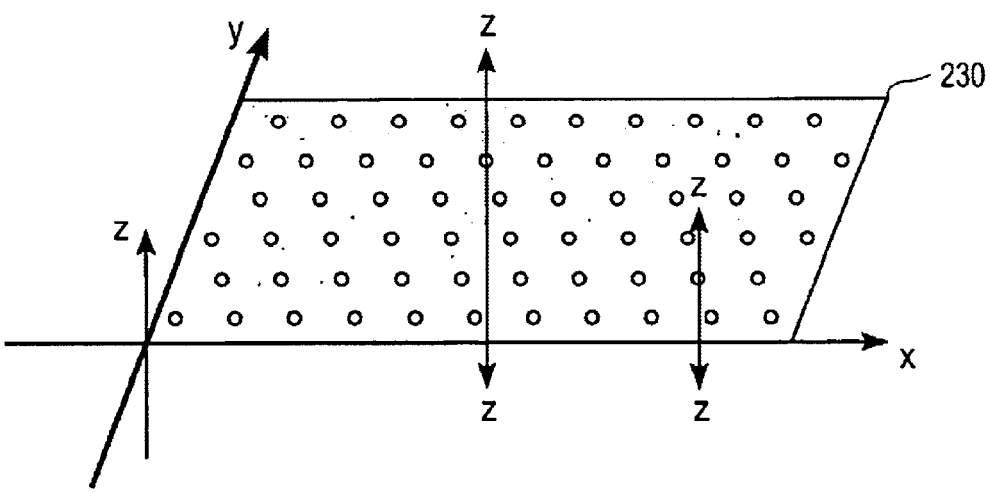
FIG. 8B illustrates an exemplary PSA with Z-direction conductive paths.

In another example, adhesive conductive in Z-direction is used (e.g., Z-PSA). The PSA of the present example is only conductive in the Z-direction as depicted in FIG. 8B, which illustrates the PSA layer 230 with multiple conducting points conducting only in the Z-direction. This means that the PSA 230 is only conductive in perpendicular direction to the surfaces (e.g., between the top and bottom surfaces) of the layer 230.

In one example, the conducting regions 234 are channels that specifically define the area where the output pixel pads 208 are to conduct with the active regions of the second layer of electrodes 110 upon contact. In another example, the conducting regions 234 are created over with the openings 114 in the case where the barrier layer 112 is used in the front plane 800. In this way, electrical connections are only established from the output pixel pads 208 to the second electrode layer 110 only through the conducting regions 234.

FIGS. 2 to 5 also illustrate methods of making exemplary embodiments of the present invention. In FIG. 2, a web line process can be used to fabricate OLED/PLED structure on the front plane 100. As the frontplane substrate 102 progresses down the web line, the first electrode layer 104 is deposited on the surface of the frontplane substrate 102. Next, the HTL layer 106 is deposited on top of the electrode layer 104 by techniques such as slot die coating or printing. Curing may be necessary. The electroluminescent medium 108 is similarly deposited on top of the HTL layer 106 in one continuous layer. Curing may also be necessary. In another example, the electroluminescent medium 108 can also be ink jetted upon the HTL layer 106.

After the electroluminescent medium 108 is coated and cured, the front plane 100 is transferred inside of a vacuum evaporator where the second electrode layer 110 can be deposited and patterned upon the electroluminescent medium 108 using a conventional shadow masking method. The barrier layer 112 is the final layer that is deposited to form the front plane 100.

The backplane 200 is separately fabricated. A web line process can also be used to fabricate the backplane 200. First, the backplane substrate 202 is provided. The receptor sites 203 are produced into the backplane substrate 202. Conventional methods such as casting, embossing, stamping, injection molding, among others are used to create receptor sites 203 that can be recessed or non-recessed into the backplane substrate 202.

The functional blocks 204 can be dispensed and transported over the substrate 202 by gravity. The functional blocks 204 can be created according to the application (Ser. No. 09/251,220) referenced above. In one example, the functional blocks 204 are embedded and recessed below the surface of the backplane substrate 202. Any conventional method of depositing microstructure onto a substrate can be used, for example, fluidic self-assembly (FSA). This process is known and is also referenced above. A slurry solution is used in FSA. One way to assist this deposition is to tilt the web line of the backplane substrate 202 during the FSA process so that gravity helps the functional blocks to couple to the receptor sites 203. A fluid flow can also be used to facilitate the dispensing of the functional blocks 204. One way to create the fluid flow is by using a suitable pump to create a continuous flow of the slurry solution to push it across the web during the FSA process. In yet another example, a pressure field can be applied to the slurry solution to facilitate the dispensing of the functional blocks. Here, pressure can be created by using an ultrasonic sound device or by applying a vibration to the web to exert forces upon slurry solution during the FSA process.

In another example, the slurry solution may be a gas or mixture of gases, such as air, nitrogen, $O_2$, $CO_2$, CO, $SF_6$, or a gas saturated with water vapor, or a liquid may be used, such as de-ionized water, formamide, ethyl alcohol, methyl alcohol, organic solvents, chlorofluorocarbons, mineral oils, liquid $CO_2$, or mixtures of these liquids, or a liquid with additives, such as de-ionized water with a surfactant or detergent agent. In such an arrangement, functional blocks are entrained in a fluid flow and carried by the transport fluid over a substrate. The fluid flow may be driven by an external force, for example, by gravity, mechanical pumping, thermal-convection currents, or bubbling a gas through a liquid transport fluid. Random motion of functional blocks over a substrate can be driven by mechanical stirring of the transport fluid, flow of the transport fluid, bubbling a gas through a liquid transport fluid, or mechanical or sonic agitation or vibration of the substrate, transport fluid, or mounting apparatus.

After the functional blocks are deposited, the planarization layer 206 is deposited and vias 207 are created. Photolithographic masking and etching are typically used to create the vias 207. The functional blocks 204 are then electrically connected with a controller through metallic buses and through the vias 207. The output pixel pads 208 are deposited over the planarization layer 206. The output pixel pads 208 are patterned over the planarization layer 206 using the same metal used for the metallic buses and vias 207.

In another example, the second planarization layer 210 is then deposited on top of the output pixel pads 208 using the same method above. Vias 209 are also created in the second planarization layer 210. Preferably, the vias 209 are created in the center of each of the adhesive conductive pads 212. Exact amount of the adhesive conductive pads 212 are lastly metered into the vias 209.

FIG. 4 also illustrates one exemplary method of how the frontplane 100 and the backplane 200 are laminated together. The front plane 100 is "flipped over" and aligned with the backplane 200 so that corresponding output pixel pads 208 are registered against the cathode pads (the second electrode layer 110) and then laminated together. When conductive adhesive deposits 212 are used, the front plane 100 is "flipped over" and aligned with the backplane 200 so that corresponding conductive adhesive deposits 212 are registered against the cathode pads. Conventional alignment and registration can be used to ensure that the conductive adhesive deposits 212 align over the openings 114. After proper alignment, the front plane 100 and the backplane 200 can be pressed together for some duration of time to ensure a complete lamination. In one example, high temperature can be used to speed up the lamination. The assembly process is completed by curing of the conductive adhesive deposits 212 and an application of a periphery seal.

In another method, the planarization layer 210 and the conductive adhesive deposits 212 are replaced by a continuous coating of the patternable pressure sensitive adhesive layer as discussed in FIGS. 8A and 8B. The patternable pressure sensitive adhesive layer (PSA) is then patterned by a bleaching process to create non-conductive and conductive regions where necessary. Alternatively, when the Z-direction conductive adhesive is used, no patterning is necessary. The non-conductive regions of the PSA layer will mitigate any electrical crosstalk between pixels. Crosstalk typically occurs when the information addressed to one singular pixel is also (to a certain degree) displayed by neighboring pixels. If the conductive adhesive (e.g., PSA) is not patterned, then the signal to one pixel would be distributed through the conductive PSA to all pixels.

The conductive adhesive deposits 212 and the conductive regions 234 in the PSA form connecting vertical channels with much smaller cross-section area than the pixel output or cathode pads. This allows (to a certain degree) for misalignment between the two substrates (e.g., the front plane 100 and the backplane 200). This concept allows for a greater tolerance in fabrication of the structure and is further illustrated in FIG. 9A through 9D.

Figure 9A:
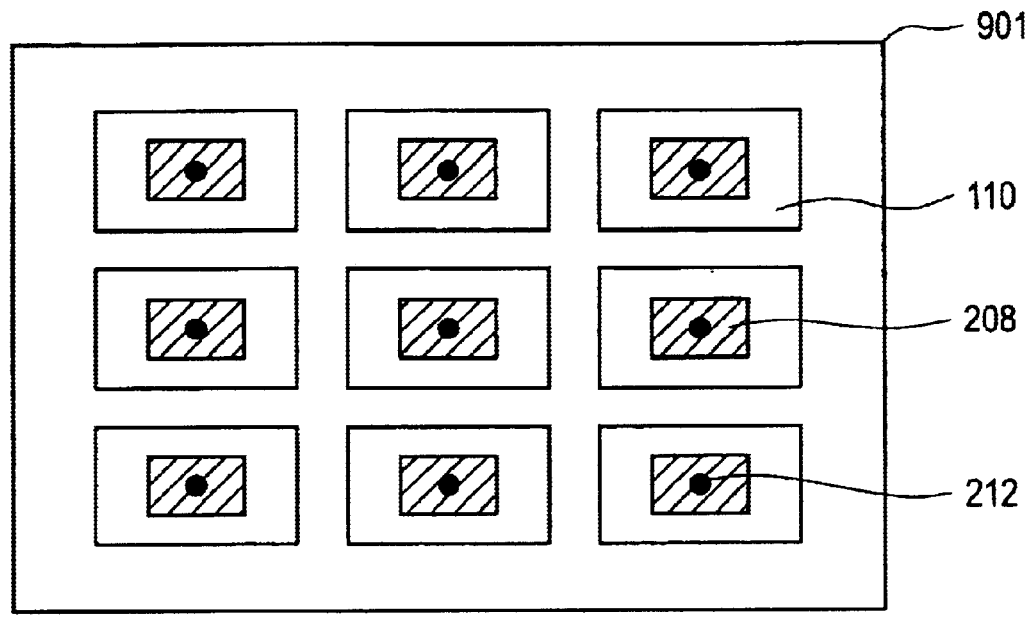
FIGS. 9A to 9D illustrate a top view of a section of an active matrix display fabricated using the exemplary electroluminescent structures of the present invention and an exemplary advantage of the present invention in alignment of the two substrates (frontplane and backplane) together.
Figure 9B:
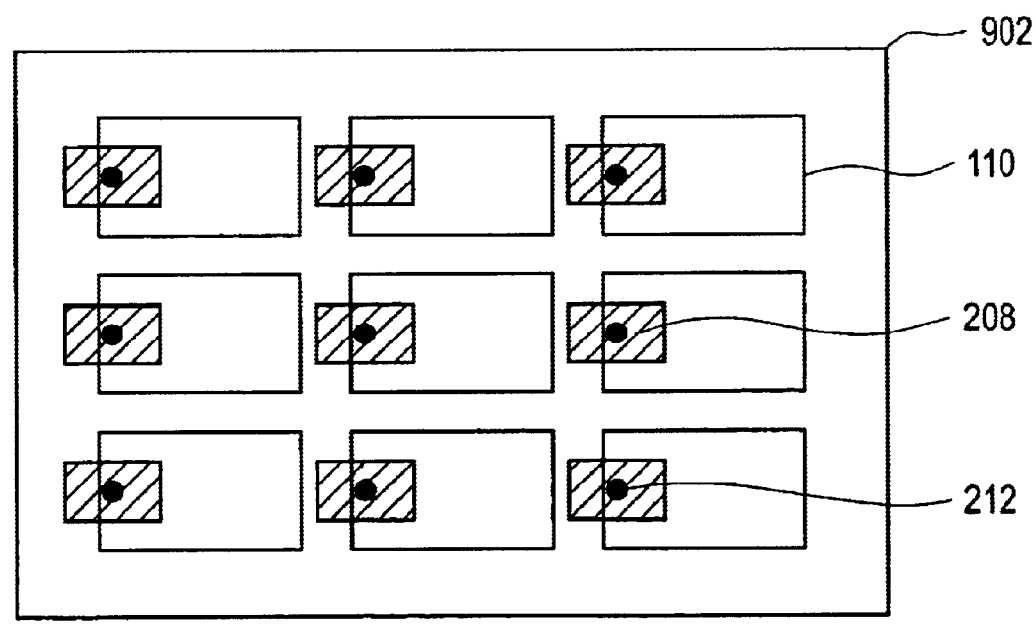

In FIG. 9A illustrates a top view of a section of an active matrix or direct driven display fabricated using the exemplary electroluminescent structures of the present invention. The conductive adhesive deposits 212 provide similar advantages as the conductive regions 234 in the PSA. For that reason, the examples relating to the conducting adhesive pads discussed below apply to the conductive regions 234 as well.

This figure shows a perfect alignment 901 of the conductive adhesive deposits 212 over the output pixel pads 208 and the cathode electrodes 110. The areas where the conductive adhesive deposits 212 are the only areas that will have electrical connections. As discussed above, the conductive adhesive deposits 212 in the present invention are metered in the vias 209. This reduces the cross-section areas where the electrical connections are to be established. In a misalignment situation 902, as shown is FIG. 9B, the electrical connection are still only established in these areas where the conductive adhesive deposits 212 are. The output pixels pads 208 may indeed touch the cathode electrodes 110 and yet, no electrical connection will be established. Short circuit, distorted images, and defective displays are a few examples of what wrong electrical connections can cause.

Figure 9C:
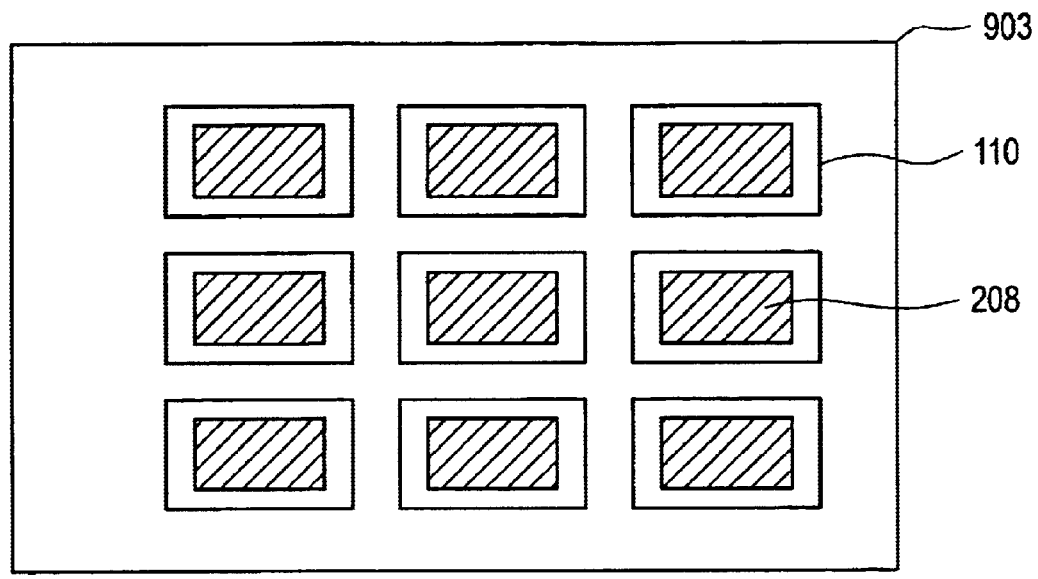
Figure 9D:
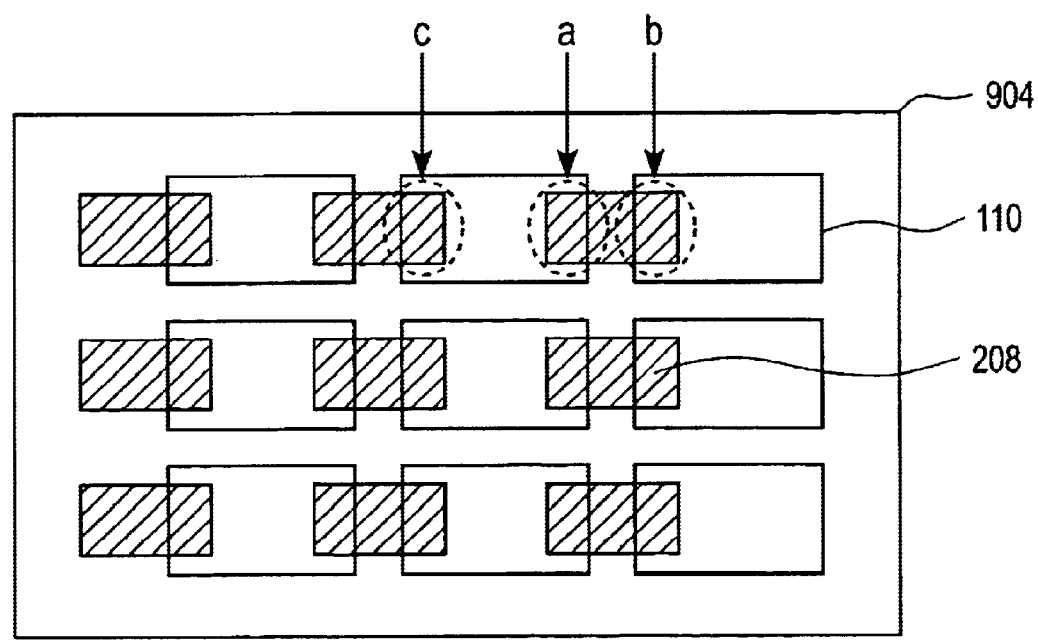

When the conductive adhesive deposits 212 and the second planarization layer 210 are not used, a more difficult and tight registration is required for aligning the front plane 100 over the backplane 200. FIG. 9C illustrates alignment situation 903 when there are no conductive adhesive deposits to narrowly define the conductive area. In the alignment situation 903, the output pixel pads 208 need to be aligned almost perfectly over the cathode electrodes 110. Electrical connections will be established where the output pixels pads 208 and the cathode electrodes 110 meet. On the other hand, as shown in FIG. 9D, when there is misalignment as in alignment situation 904, regions a, b and c illustrate the area where electrical connections occur. This type of multiple electrical connections will cause electrical cross-talk, distorted images, and defective displays, to name a few.

Also, a precise and tight registration requires much more time and labor for laminating the front plane 100 to the backplane 200. This will transfer to cost and inefficiency in fabricating display devices that utilize the electroluminescent structure.

The split fabrication with large assembly tolerance also leads to a new concept of tiled display—where one substrate (e.g., front plane 100) can be continuous or global while the other (e.g., backplane 200) is tiled. Such an embodiment mitigates the effects of cumulative errors in registration typical for two large substrates that are used for the front plane and the backplane of the tiled display. A preferred embodiment is one where the display media substrate is a continuous OLED or PLED structure to create a seamless tiled display. The tiled displays having a diagonal dimension of approximately thirty inches to fifty inches have been used for television screens, advertisement screen, stadium or concert displays.

Figure 10A:
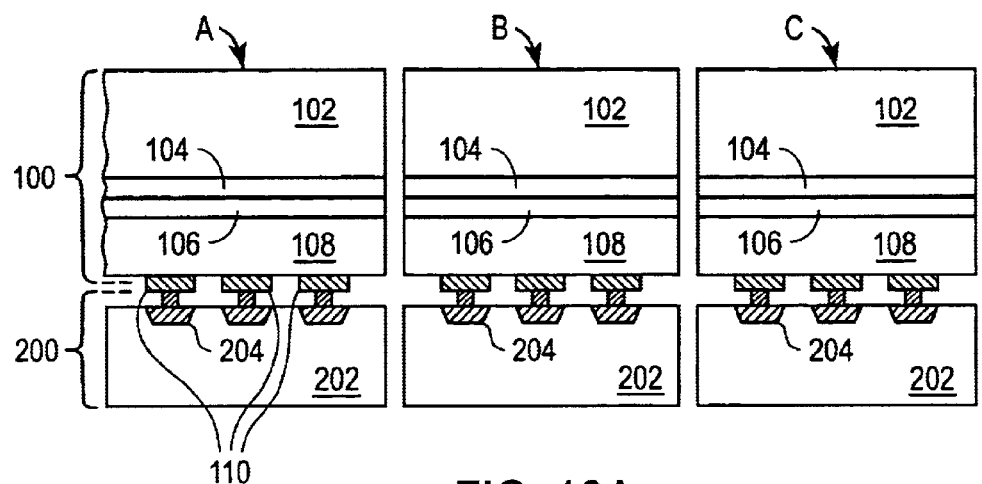
FIG. 10A illustrates an exemplary tiled display fabricated according to some embodiments of the present invention.

FIG. 10A illustrates that since it is hard to make a large display that is uniform, one conventional approach of making a tiled display is to make separate modules or units (e.g., modules A, B, and C). Each of the modules is fabricated much like that for a small display. The modules are then arranged and adhered next to each other to form the large display. Thus, each of the modules A, B, and C are arranged next to each other to form the large display. This arrangement causes gaps between each of the modules and these gaps are clearly visible making the tiled display aesthetically unacceptable. Another problem with the current art is that when the displays are made out of OLED or PLED structures, the light emissions are known to be stronger at the edges due to light piping, hence making the tiled display even less acceptable due to delineation of the tiles' boundaries.

Figure 10B:
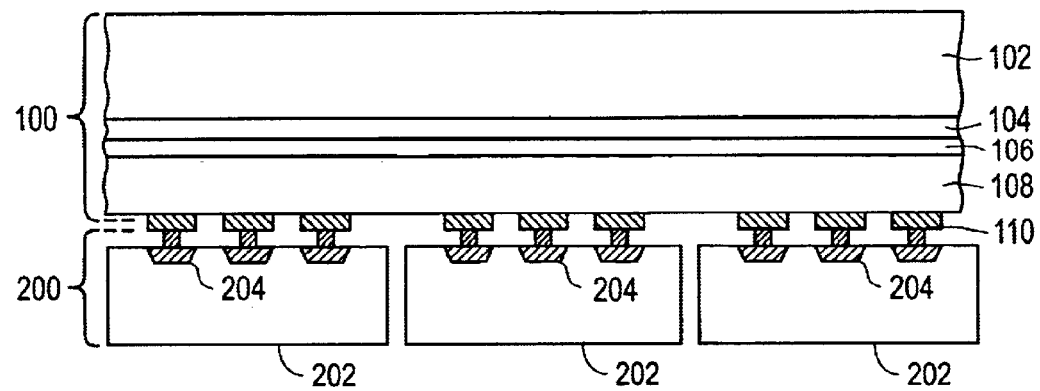
FIG. 10B illustrates an exemplary tiled display fabricated according to a current state of the art.

FIG. 10B illustrates a uniform tiled display made according to some of the embodiments of the present invention. In FIG. 10B, the frontplane 100 which comprises the frontplane substrate 102, the ITO layer 104, the HTL layer 106, and the electroluminescent medium 108, all of which are continuous sheets stacked or disposed on top of each other. There is no gap in the display area. Only the substrates with the driving circuits (e.g., the functional blocks 204) are made as individual modules. Thus, active and/or passive components (e.g., functional blocks 204 or NanoBlock™ IC, or metallization layers) that drive the display are separated in discrete units (tiles or modules). The large display of the present invention has a front plane with display media in a form of a global, continuous sheet and tiled only the backplane.

The same fabrication line used to make normal size display can also be used to fabricate the large display of the current invention. The front plane 100 which incorporates the display medium (OLED or PLED) is fabricated separately from the other module backplanes 200 that carry the functional blocks 204. The module backplanes 200 can be used for normal size displays, small displays, or large tiled displays without the manufacturer needing to develop separate fabrication line for each.

An active matrix display (not shown) can be made according to some of embodiments of the present invention. Conventional methods can be combined with the method of the present invention. In one example, the backplane may be formed by depositing blocks, using an FSA technique, into a substrate (e.g. glass) as discussed above. Each block contains an electrical devices such as transistors, capacitors or resistors that perform a functions in driving pixel images. The electrical devices within each block are interconnected to other blocks by conductive buses. The active medium (e.g., OLED/PLED), which is fabricated according to FIGS. 2 discussed above, is joined to the backplane as discussed above (e.g., flipping over onto the backplane). The pixel electrodes optically change in response to the combined voltages or currents produced by the pixels electrodes. The active medium over a given pixel electrode will appear as a square or dot in the overall x-y type matrix of the display.

I claim:

1. A method of fabricating a display structure comprising:
   coupling a frontplane to a backplane wherein a frontplane top surface laminates to a backplane top surface, said frontplane and said backplane are fabricated separately, said frontplane further includes a frontplane substrate and said backplane further includes a backplane substrate, wherein;
   a first electrode layer which is transparent is disposed over said frontplane substrate;
   a display medium which produces electro-optical effects upon a voltage application is disposed over said first electrode;
   a second electrode layer which is patterned is disposed over said display medium, said second electrode layer includes a plurality of connecting regions; and
   said backplane is electrically active to provide driving signals for said display medium wherein said backplane substrate includes a plurality of output pads to match said plurality of connecting regions;
   coating said plurality of output pads with an insulation layer having plurality of vias; and
   forming conductive adhesive deposits over said first plurality of vias, said conductive adhesive deposits conduct said driving signals.

2. A method as in claim 1 wherein said display structure is a flat panel display structure and wherein said electrical signals drive pixels images of said flat panel display structure.

3. A method as in claim 1 wherein said backplane is one of an active matrix array of thin films transistors and an active matrix array of diodes.

4. A method as in claim 1 wherein each of said plurality of functional blocks is a microstructure.

5. A method as in claim 1 wherein said display medium is an electroluminescent medium.

6. A method as in claim 5 wherein said electroluminescent medium is made of any one of organic light emitting diode organic materials, light emitting polymer materials, polymer light emitting diodes, and thin film electroluminescent displays.

7. A method as in claim 1 wherein said display medium is formed from a solid film.

8. A method as in claim 1 further comprising:
   coating said plurality of output pads with an insulation layer having plurality of vias.

9. A method as in claim 1 wherein said second electrode layer is transparent.

10. A method as in claim 1 wherein said first electrode layer is an anode layer made out of a transparent conducting material.

11. A method as in claim 1 wherein said first electrode layer is made of a high workfunction material.

12. A method as in claim 1 wherein said second electrode layer is made of a low workfunction material.

13. A method as in claim 1 wherein said first electrode layer is any one of an indium tin oxide and a mixture of indium oxide and tin oxide material.

14. A method as in claim 1 wherein said second electrode layer is made from any one of an aluminum, a calcium, and a magnesium.

15. A method as in claim 1 wherein said frontplane substrate is made out of anyone of a silica, glass, transparent polymer, sapphire, quartz, and transparent plastic.

16. A method as in claim 1 wherein said backplane substrate is made out of material selected from the group consisting of ceramic, glass, plastic, silicon wafer, gallium arsenide wafer, silica, and metal.

17. A method as in claim 1 wherein said backplane substrate is any one of a rigid substrate and a flexible substrate.

18. A method as in claim 1 further comprising:
   coating a pressure sensitive conductive layer over said plurality of output pads;
   treating said pressure sensitive conductor layer such that said pressure sensitive conductor layer includes conducting regions and nonconducting regions, said conducting regions matching with said plurality of output pads and said connecting regions.

19. A method as in claim 18 wherein said pressure sensitive conductor layer is a patternable pressure sensitive adhesive wherein said treating includes patterning said patternable pressure sensitive adhesive.

20. A method as in claim 18 wherein said pressure sensitive conductor layer is a Z-direction conductive film conducting only in a perpendicular direction to a top surface and a bottom surface of said Z-direction conductive film.

21. A display structure comprising:
   a frontplane coupling to a backplane, a first top surface of said frontplane laminates to a second top surface said backplane, said frontplane and said backplane are fabricated separately, said frontplane further includes a frontplane substrate and said backplane further includes a backplane substrate, wherein;
   a first electrode layer which is transparent is disposed over said frontplane substrate;
   a display medium which produces electro-optical effects upon a voltage application is disposed over said first electrode;
   a second electrode layer which is patterned is disposed over said display medium, said second electrode layer includes a plurality of connecting regions; and said backplane is electrically active to provide driving signals for said display medium wherein said backplane substrate includes a plurality of output pads to match said plurality of connecting regions;
   an insulation layer having a plurality of vias formed over said plurality of output pads; and
   conductive adhesive deposits formed over said first plurality of vias, said conductive adhesive deposits conduct said driving signals.

22. A display structure as in claim 21 wherein said electroluminescent display structure is a flat panel display structure and wherein said electrical signals drive pixels of said flat panel display structure.

23. A display structure as in claim 21 wherein said backplane is one of an active matrix array of thin films transistors and an active matrix array of diodes.

24. A display structure as in claim 21 wherein each of said plurality of functional blocks is a microstructure.

25. A display structure as in claim 21 wherein said display medium is an electroluminescent medium.

26. A display structure as in claim 25 wherein said electroluminescent medium is made of any one of organic light emitting diode organic materials, light emitting polymer materials, polymer light emitting diodes, and thin film electroluminescent displays.

27. A display structure as in claim 21 wherein said display medium is formed from a solid film.

28. A display structure as in claim 21 further includes an insulation layer having a plurality of vias formed over said plurality of output pads.

29. A display structure as in claim 21 wherein said second electrode layer is transparent.

30. A display structure as in claim 21 wherein said first electrode layer is an anode layer made out of a transparent conducting material.

31. A display structure as in claim 21 wherein said first electrode layer is any one of an indium tin oxide and a mixture of indium oxide and tin oxide.

32. A display structure as in claim 21 wherein said first electrode layer is made of a high workfunction material.

33. A display structure as in claim 21 wherein said second electrode is made of material having a low workfunction value.

34. A display structure as in claim 21 wherein said second electrode layer is made from any one of an aluminum, a calcium, and a magnesium.

35. A display structure as in claim 21 wherein said frontplane substrate is made out of anyone of a silica, glass, transparent polymer, sapphire, quartz, and transparent plastic.

36. A display structure as in claim 21 wherein said backplane substrate is made out of material selected from the group consisting of ceramic, glass, plastic, silicon wafer, gallium arsenide wafer, silica, and metal.

37. A display structure as in claim 21 wherein said backplane substrate is any one of a rigid substrate and a flexible substrate.

38. A display structure as in claim 21 further comprising a pressure sensitive conductive layer coated over said plurality of output pads, said pressure sensitive conductor layer is treated such that said pressure sensitive conductor layer further includes conducting regions and nonconducting regions, said conducting regions matching with said plurality of output pads and said connecting regions.

39. A display structure as in claim 38 wherein said pressure sensitive conductor layer is a patternable pressure sensitive adhesive wherein said patternable pressure sensitive conductor layer is patterned to include said conducting regions and said nonconducting regions to match said plurality of said connecting regions.

40. A display structure as in claim 38 wherein said pressure sensitive conductor layer is a Z-direction conductive film conducting only in a perpendicular direction to a top surface and a bottom surface of said Z-direction conductive film.

* * * * *